(12) United States Patent
Wang et al.

(10) Patent No.: US 7,928,383 B2
(45) Date of Patent: Apr. 19, 2011

(54) CHARGED PARTICLE SYSTEM INCLUDING SEGMENTED DETECTION ELEMENTS

(75) Inventors: Joe Wang, Campbell, CA (US); Xu Zhang, Hayward, CA (US); Zhong-Wei Chen, San Jose, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 214 days.

(21) Appl. No.: 12/204,282

(22) Filed: Sep. 4, 2008

(65) Prior Publication Data
US 2008/0315094 A1 Dec. 25, 2008

Related U.S. Application Data

(63) Continuation of application No. 11/668,846, filed on Jan. 30, 2007.

(51) Int. Cl.
*H01J 49/00* (2006.01)
*B01D 59/44* (2006.01)

(52) U.S. Cl. ........ 250/310; 250/397; 250/398; 250/306; 250/311

(58) Field of Classification Search .................. 250/397, 250/398
See application file for complete search history.

(56) References Cited

U.S. PATENT DOCUMENTS

| 4,068,123 | A | * | 1/1978 | Kokubo | 250/311 |
| 4,675,524 | A | | 6/1987 | Frosien et al. | |
| 4,700,075 | A | | 10/1987 | Kurz et al. | |
| 4,713,543 | A | | 12/1987 | Feuerbaum et al. | |
| 4,728,790 | A | * | 3/1988 | Plies | 250/305 |
| 4,808,821 | A | | 2/1989 | Feuerbaum et al. | |
| 4,818,874 | A | | 4/1989 | Ishikawa | |
| 4,831,266 | A | * | 5/1989 | Frosien et al. | 250/397 |
| 4,926,054 | A | * | 5/1990 | Frosien | 250/396 R |

(Continued)

FOREIGN PATENT DOCUMENTS

DE 3925949 A1 2/1991

OTHER PUBLICATIONS

Tsuno, K., "Aberration analysis of a Wien filter for electrons," Wissenschaftliche Verlagsgesellschaft mbH Stuugart, 1991, pp. 31-40, vol. 89—No. 1.

(Continued)

*Primary Examiner* — David A Vanore
(74) *Attorney, Agent, or Firm* — Sawyer Law Group, P.C.

(57) ABSTRACT

A charged particle detector consists of a plurality independent light guide modules assembled together to form a segmented in-lens on-axis annular detector, with a center hole for allowing the primary charged particle beam to pass through. One side of the assembly facing the specimen is coated with or bonded to scintillator material as the charged particle detection surface. Each light guide module is coupled to a photomultiplier tube to allow light signals transmitted through each light guide module to be amplified and processed separately. A charged particle detector is made from a single block of light guide material processed to have a cone shaped circular cutout from one face, terminating on the opposite face to an opening to allow the primary charged particle beam to pass through. The opposite face is coated with or bonded to scintillator material as the charged particle detection surface. The outer region of the light guide block is shaped into four separate light guide output channels and each light guide output channel is coupled to a photomultiplier tube to allow light signal output from each channel to be amplified and processed separately.

20 Claims, 12 Drawing Sheets

U.S. PATENT DOCUMENTS

| | | | | |
|---|---|---|---|---|
| 5,004,918 | A | 4/1991 | Tsuno | |
| 5,198,675 | A | 3/1993 | Hikita et al. | |
| 5,498,874 | A | 3/1996 | Miyoshi et al. | |
| 5,665,968 | A | 9/1997 | Meisburger et al. | |
| 5,717,204 | A | 2/1998 | Meisburger et al. | |
| 5,872,358 | A | 2/1999 | Todokoro et al. | |
| 6,194,729 | B1 | 2/2001 | Weimer | |
| 6,365,896 | B1 | 4/2002 | van der Mast | |
| 6,380,546 | B1 | 4/2002 | Petrov et al. | |
| 6,392,231 | B1* | 5/2002 | Chen | 250/310 |
| 6,407,387 | B1 | 6/2002 | Frosien et al. | |
| 6,426,501 | B1* | 7/2002 | Nakagawa | 850/5 |
| 6,462,467 | B1 | 10/2002 | Russ | |
| 6,463,124 | B1 | 10/2002 | Weisman et al. | |
| 6,545,277 | B1 | 4/2003 | Kella et al. | |
| 6,605,805 | B2 | 8/2003 | Chen | |
| 6,617,579 | B2 | 9/2003 | Yonezawa | |
| 6,642,520 | B2 | 11/2003 | Kimura et al. | |
| 6,768,324 | B1* | 7/2004 | Yamada et al. | 324/751 |
| 6,775,452 | B2 | 8/2004 | Howells | |
| 6,853,143 | B2* | 2/2005 | Nakasuji et al. | 315/111.81 |
| 6,855,938 | B2 | 2/2005 | Preikszas et al. | |
| 6,960,766 | B2 | 11/2005 | Chen | |
| 6,972,412 | B2* | 12/2005 | Scholtz et al. | 250/396 R |
| 6,975,125 | B2* | 12/2005 | Yamada et al. | 324/751 |
| 7,067,807 | B2 | 6/2006 | Petrov et al. | |
| 7,098,468 | B2 | 8/2006 | Aloni et al. | |
| 7,161,667 | B2 | 1/2007 | Meeks et al. | |
| 7,180,317 | B2 | 2/2007 | Hollman | |
| 7,312,449 | B2* | 12/2007 | Nakasuji et al. | 250/311 |
| 7,385,195 | B2* | 6/2008 | Yamada et al. | 250/307 |
| 7,521,700 | B2 | 4/2009 | Aloni et al. | |
| 7,544,937 | B2 | 6/2009 | Frosien | |
| 7,598,499 | B2* | 10/2009 | Platzgummer | 250/398 |
| 7,612,337 | B2* | 11/2009 | Suzuki et al. | 250/310 |
| 7,645,989 | B2 | 1/2010 | Bihr et al. | |
| 7,652,263 | B2 | 1/2010 | Feuerbaum | |
| 7,705,298 | B2* | 4/2010 | Liu et al. | 250/306 |
| 7,705,301 | B2* | 4/2010 | Tseng et al. | 250/310 |
| 7,759,653 | B2 | 7/2010 | Chen et al. | |
| 2003/0155509 | A1* | 8/2003 | Nakasuji et al. | 250/310 |
| 2004/0239347 | A1* | 12/2004 | Yamada et al. | 324/751 |
| 2005/0023491 | A1 | 2/2005 | Young et al. | |
| 2005/0133733 | A1* | 6/2005 | Nakasuji et al. | 250/492.1 |
| 2006/0202119 | A1* | 9/2006 | Yamada et al. | 250/310 |
| 2006/0243918 | A1 | 11/2006 | Aloni et al. | |
| 2008/0067380 | A1* | 3/2008 | Ozawa et al. | 250/310 |
| 2008/0099693 | A1* | 5/2008 | Platzgummer | 250/398 |
| 2008/0217529 | A1* | 9/2008 | Sukegawa et al. | 250/306 |
| 2008/0315094 | A1* | 12/2008 | Wang et al. | 250/310 |
| 2009/0090866 | A1 | 4/2009 | Zhang et al. | |
| 2009/0242792 | A1* | 10/2009 | Hosoya et al. | 250/397 |
| 2009/0294664 | A1 | 12/2009 | Chen et al. | |
| 2010/0028235 | A1 | 2/2010 | Qin et al. | |
| 2010/0102227 | A1 | 4/2010 | Chen et al. | |
| 2010/0118310 | A1* | 5/2010 | Matsui | 356/446 |
| 2010/0150429 | A1 | 6/2010 | Jau et al. | |

OTHER PUBLICATIONS

Ludwig Reimer, "Image Formation in Low-Voltage Scanning Electron Microscopy", SPIE Optical Engineering Press, Tutorial Texts vol. TT12, 1993, 16 total pages (pp. 12, 13, 28-41, 88-101).

Ronnie Porat, et al., "SEM-based methodology for root cause analysis of wafer edge and bevel defects", IEEE/SEMI Advanced Semiconductor Manufacturing Conference, pp. 11-12, 2008.

Jaime D. Morillo, et al., "Edge and Bevel Automated Defect Inspection for 300mm Production Wafers in Manufacturing", IEEE/SEMI Advanced Semiconductor Manufacturing Conference, pp. 1-4, 2005.

\* cited by examiner

Incoming electrons

CHARGED PARTICLE SYSTEM INCLUDING SEGMENTED DETECTION ELEMENTS

CROSS-REFERENCES TO RELATED APPLICATIONS

This application is a Continuation of U.S. Ser. No. 11/668,846 filed Jan. 30, 2007, the disclosures of which are incorporated herein by reference.

FIELD OF THE INVENTION

The present invention relates generally to detection devices and more particularly to charged particles detection devices.

BACKGROUND OF THE INVENTION

A charged particle detector is the indispensable part of a charged particle (ion or electron beam) instrument, such as a scanning electron microscope (SEM). In a SEM, an electron beam emanated from an electron source is focused into a fine probe over a specimen surface and scanned by a deflection unit in a raster fashion; and signal electrons released from the specimen, including secondary electrons and back scattered electrons, are collected by charged particle detectors and the signal intensity is converted into the gray level of an image pixel corresponding to the location of the electron probe on the specimen surface. Scanning of the electron probe will then form a gray level mapping for producing the image of the specimen surface. A low voltage SEM, in which an incident electron beam has the energy of 3 keV or less, is known to be particularly effective in evaluating topographic features of specimen surface due to the dominance of secondary electrons in the signal electrons. Secondary electrons are originated within a shallow depth from the specimen surface; their yield and trajectory are influenced by the surface topography and thus carry the topographic information.

Figure 1:
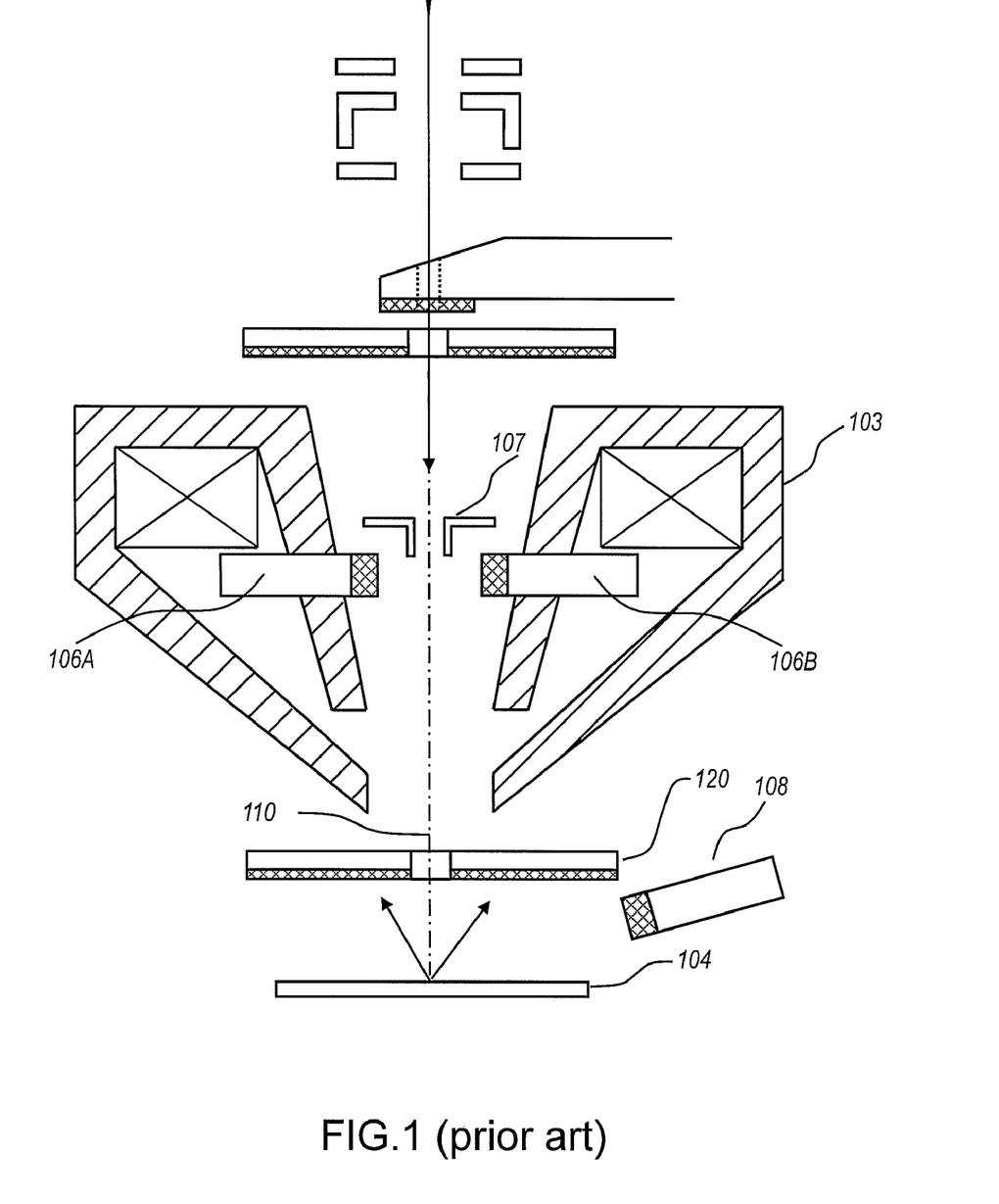
FIG. 1 is a schematic illustration of prior arts electron detection systems for SEM.

The most common detectors used in SEM are of the scintillator-photomultiplier tube (PMT) combination type (such as an Everhart-Thornley detector), the semiconductor type, and the microchannel plate (MCP) type. The scintillator-PMT type detector, due to high gain and low noise properties, is more frequently used in high resolution SEM in which the beam current is low. Furthermore, the scintillator-PMT type detector generally comprises a light guide rod that has a front face coated with a light-generating scintillator and is coupled to a photomultiplier tube to form a unit. A common arrangement is to position one or a multiple of these units below the final focusing objective lens, surrounding the impact point of the primary electron beam, with the front face covered with a positively biased grid to attract the secondary electrons emitted from the specimen in what amounts to a side detection scheme. FIG. 1 is a schematic diagram illustrating the fundamental structures of a conventional SEM. A side detector 108 is inserted between an objective lens 103 and a specimen 104. Recently, increased demand on low voltage SEMs of higher resolution has prompted more widespread use of SEMs with an immersion type of objective lens for its ability to provide finer electron probes due to smaller electron optical aberrations. In a SEM with an immersion type of objective lens, the specimen is immersed in the strong magnetic focusing field of the objective lens, over which an electrostatic extraction field is also typically superimposed. While the main purpose is to focus the primary electron beam, the magnetic field also confines the secondary electron trajectories close to the central optical axis, with the electrostatic field acting to pull the electrons away from the specimen 104 into the center bore of the objective lens 103. In this case, the side detector 108 can no longer receive any secondary electrons, and in-lens detectors must be used instead. The side detector has the advantage of detecting sample three dimensional topographic information and the in-lens detector has the advantage of high detection efficiency. In order to detecting more sample topographic information, the present invention proposes a multiple channel in-lens detection system, in which the multiple channels are annular systematically distributed around the primary beam, forming an on-axis detection system.

Multi-channel detection system can be used for enhancing topographic features on the specimen surface without tilting the specimen. The detector in such a detection system is divided into equal halves or quarters from which signal outputs are respectively processed and displayed separately. Such idea is often used in off-lens detection system. As illustrated in FIG. 1, a segmented front lens Robinson detector 120 is positioned under the lower face of the objective lens 103 and faces the specimen 104 for receiving mainly backscattering electrons. Each of the segments of the detector 120 has independent channels to form images. The signals from the channels of the detector 120 are processed, including addition or subtraction, to provide large quantity of information of the specimen 104 including topographic and material information.

Compared to an off-axis detector, on-axis in-lens detector benefits the system resolution. Off-axis in-lens detector needs a Wien filter to band the secondary electron off axis and guide them to the detector. Banding secondary electron off axis introduces the second order aberration for a primary beam and lowers the resolution of a system.

Figure 2:
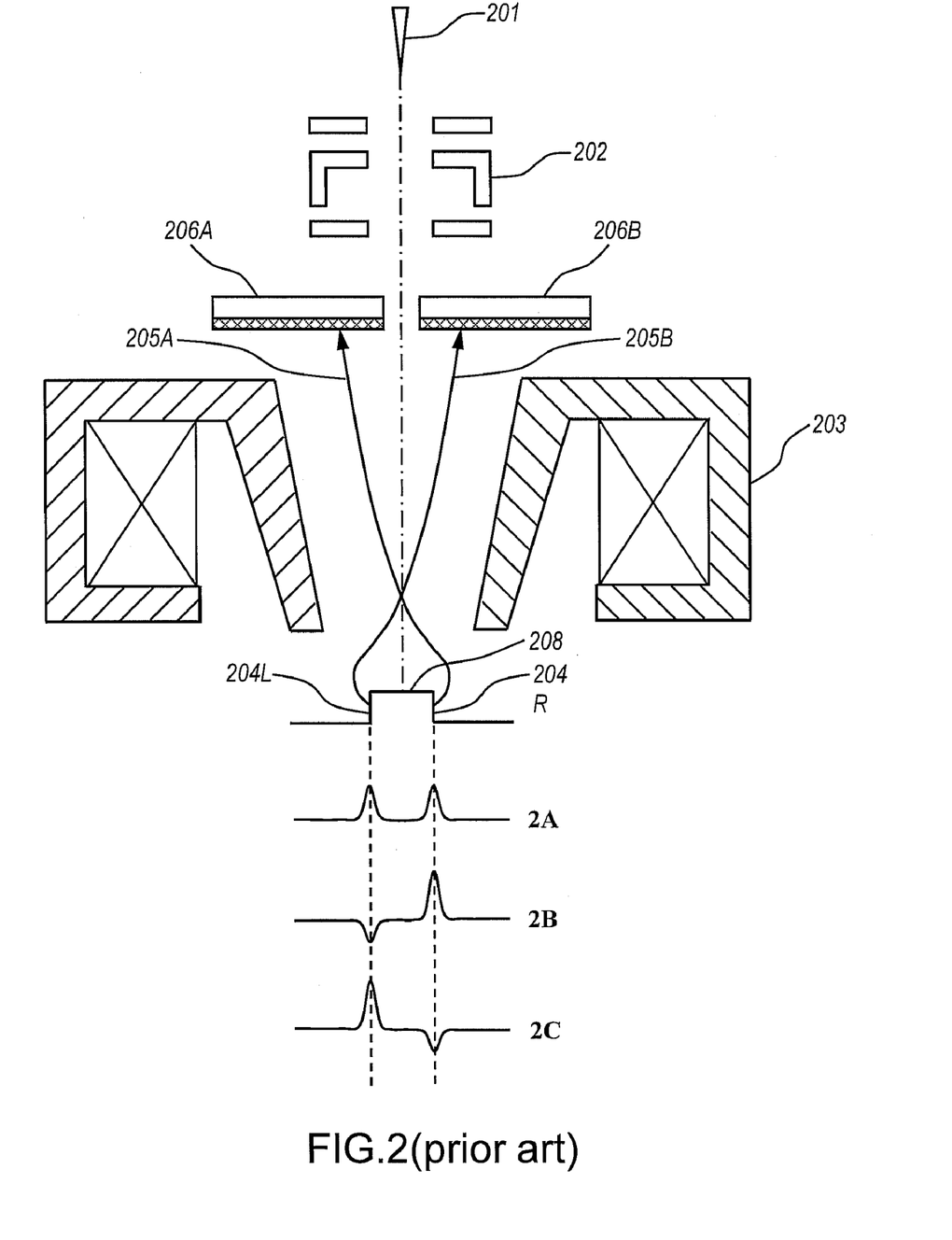
FIG. 2 is a schematic illustration of an SEM with an immersion type of magnetic objective lens and on-axis detectors, illustrating the benefit of segmented in-lens on-axis annual detectors in enhancing the appearance of surface topographic features.

The annular and symmetric arrangement of the multiple channels addresses the three dimensional topographic imaging of a sample surface. As illustrated in FIG. 2, secondary electrons 205B emanated from the side surface 204L of a surface feature 208 strike a detector half 206B, while another secondary electrons 205A from the side surface 204R strike another detector half 206A, after crossing the optical axis under the focusing effect of the magnetic field from the objective lens 203. When the signals respectively from the halves are added together as in a non-segmented detector case, both edges of the surface feature 208 will demonstrate bright in the image (as illustrated in the line profile 2A) as more secondary electrons 205A or 205B are emitted along the side wall region, making it difficult to discern whether the surface feature 208 is a protrusion or a depression. However, when the signals from the halves are displayed individually, a shadow effect is directed to one bright edge of the surface feature 208 compared to the dark one, as illustrated in the line profile 2B from the detector half 206A and the line profile 2C from the detector half 206B. Thus, a three-dimensional impression is generated and directed to the protrusion of the surface feature 208. In the case of a two-channel detector 109, as illustrated in FIG. 1, sandwiching the primary beam, the shadow effect may be formed in the direction perpendicular to the two-channel detector 109 rather than parallel to the two-channel detector 109. Thus, three-dimension sample surface information can be distorted on the image obtained from the two-channel detector 109.

An alternative detector configuration potential to overcome this problem, an annular in-lens on-axis symmetrically distributed multi-channel detection system has, however, never been made or reported, for example the in-lens segmented multi-channel on-axis Scintillator-PMT type, semiconductor type or micro-plate type of detectors.

Currently, either a single detector is used on axis or multiple detectors are arranged separately around the center optical axis, often working in conjunction with a reflection plate 107 which generates its own secondary electrons to be collected by the detectors, when the plate is struck by the secondary and back-scattered electrons coming from the specimen. These arrangements are schematically illustrated in FIG. 1, with multiple in-lens detectors 106A and 106B positioned off axis in conjunction with a reflection plate 107 the two pieces of detectors 109 is sandwiching the optical axis, and a single Scintillator-PMT detector 105 is positioned on axis. For the multiple detector arrangement the configuration is complicated and the signal collection efficiency is mediocre due to the spatial separation of the individual detectors, while for the single on-axis detector case it is difficult to achieve a uniform signal collection due to the non-rotational-symmetric nature of the light-guide tube.

Accordingly, there is a need in the art for innovative designs for charged particle detectors, so that the high efficiency space saving segmented multi-channel in-lens on-axis annular configuration or its equivalent can be realized for Scintillator-PMT type, semiconductor type or micro-plate type of detectors.

BRIEF SUMMARY OF THE INVENTION

This invention is directed to provide designs for an annular in-lens on-axis symmetrically distributed multi-channel detection system. The detectors can be Scintillator-PMT, semiconductor or micro-plate type and include one or more light guide modules arranged in a rotational symmetric configuration, which address a segmented on-axis annular configuration for the annular in-lens on-axis symmetrically distributed multi-channel detection system.

In one embodiment, for an exemplary charged particle detector in accordance with the present invention, four light guide modules are assembled in a rotational symmetric configuration to form a single assembly, with a square center opening on the center optical axis for allowing the primary charged particle beam to pass through. The flat side of the single assembly facing a specimen is coated with or coupled to Scintillator material. Each light guide module is coated with aluminum for internal light reflection and light separation between adjacent light guide modules, except the light exit face which is coupled to a PMT module to allow signals transmitted from each prism to be amplified and processed separately.

The other embodiment of the charged particle detector in accordance with the present invention, a single light guide material is machined to have a cone shaped circular cutout from one side, with the tip of the cone terminating on the opposite side to an opening to allow the primary charged particle beam to pass through. The opposite side is coated with or coupled to scintillator material. The outer region of the light guide is shaped into four light guide channels and coupled to PMT modules. The whole light guide is coated with aluminum for internal light reflection except the light incoming and exiting faces.

Accordingly, the present invention provides a charged particle detector for detecting secondary electrons, back-scattered electrons, or ions. In the charged particle detector, a charged particle detection assembly includes a plurality of detection segments, each of which is coupled to a pre-amplifier for amplifying an output signal of the detection segment. Furthermore, each of the detection segments includes a charged particle detection module having a charged particle receiver and a detection signal generator coupled to each other, the detection signal generator generates the output signal upon the charged particle receiver being bombarded by a charged particle beam.

The details of one or more embodiments are set forth in the accompanying drawings and the description below. Other features, objects, and advantages will be apparent from the description and drawings, and from the claims.

DETAILED DESCRIPTION OF THE INVENTION

Detection devices and more specifically to charged particles detection devices for are illustrated herein. The following description is presented to enable one of ordinary skill in the art to make and use the invention and is provided in the context of a patent application and its requirements. Various modifications to the preferred examples and the generic principles and features described herein will be readily apparent to those skilled in the art. Thus, the present invention is not intended to be limited to the examples illustrated, but is to be accorded the widest scope consistent with the principles and features described herein.

Figure 3A:
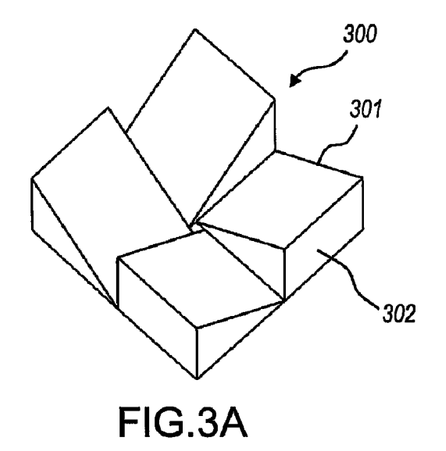
FIG. 3A to 3J shows detector assemblies in accordance with an embodiment of the present invention.
Figure 3B:
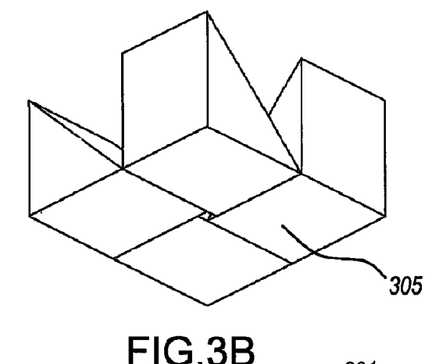
Figure 3C:
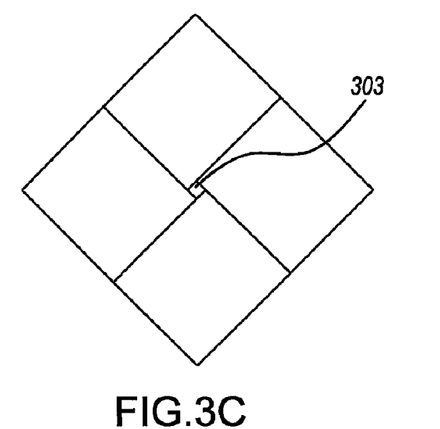
Figure 3D:
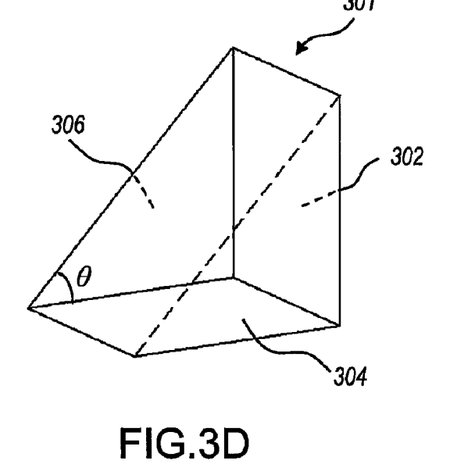
Figure 3E:
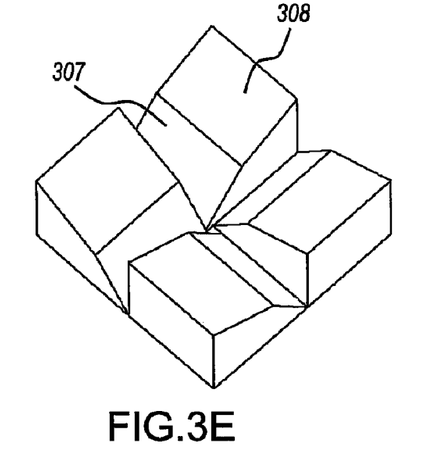
Figure 3F:
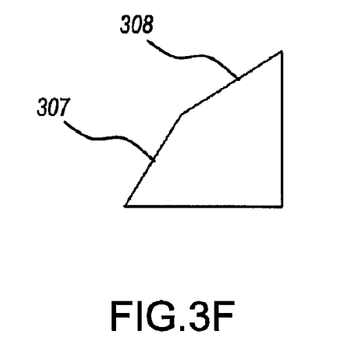
Figure 3G:
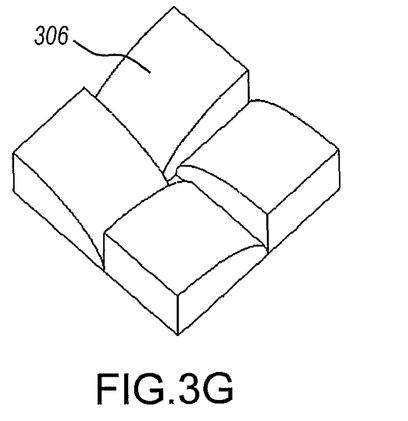
Figure 3H:
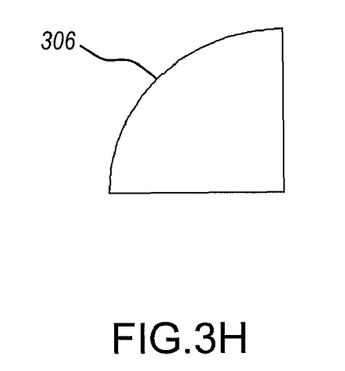
Figure 3I:
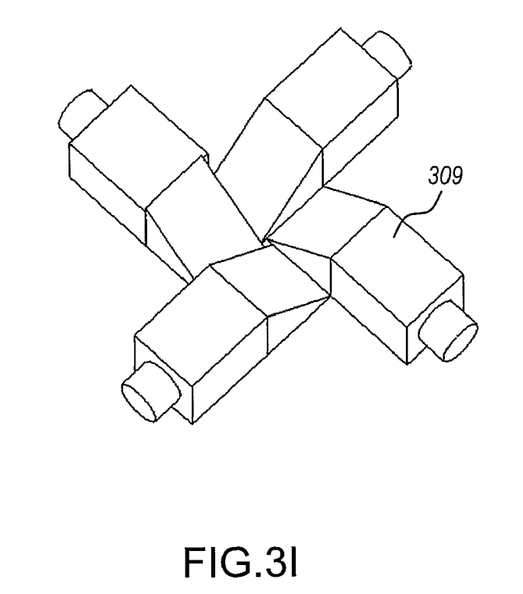
Figure 3J:
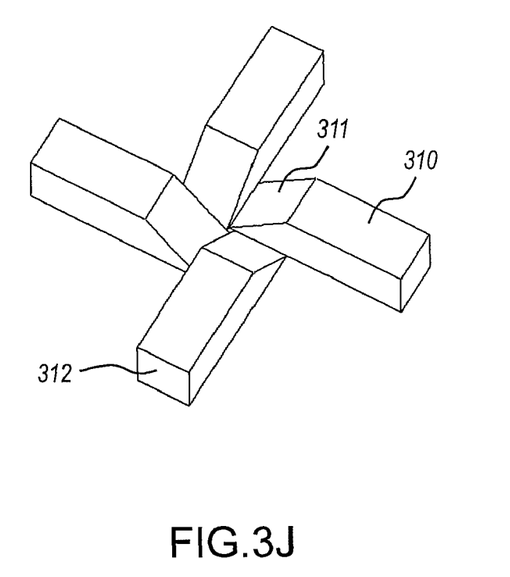

A first example of a charged particle detector assembly in accordance with the present invention will be described in detail with reference to FIG. 3A through FIG. 3J. FIG. 3A, FIG. 3B and FIG. 3C illustrate the tilted top view, tilted bottom view, and top view of the detector light guide assembly 300, respectively. As illustrated in FIG. 3A and FIG. 3D, four individual triangular prisms 301 are assembled in an off-center configuration to form a light guide assembly 300, with a square opening 303 in the center as illustrated in FIG. 3C. Before the assembly step, one side 304 of the triangular prism 301 is coated with a scintillator material (for example, phosphor scintillator such as P47) to form a detection surface. Next, all sides of the triangular prism 301, exclusive of a side 304, are coated with aluminum or other reflective material for internal light reflection and light isolation between adjacent modules. Then four prisms 301 are so assembled to make four the sides 304 coplanar for the formation of a flat detection surface 305 as illustrated in FIG. 3B. As illustrated in FIG. 3C, the prisms 301 are respectively offset sideways with respect to the center hole 303. When viewed from the top the light guide assembly 300 is 90-degree rotational symmetric, but not mirror symmetric with respect to the central axis of the center hole 303. This kind of configuration addresses simple construction from commercially available prisms without any modification. For example, regular right angle prisms can be used. When installed in a charged particle instrument, the opening 303 will be aligned with the center optical axis of the instrument for allowing the primary charged particle beam to pass through. The angle θ between the side 304 and the side 306 of the prism 301 can be available between 0 and 90 degrees as illustrated in FIG. 3D, in accordance with one example of the present invention. It is noted that a triangular prism 301, for example but not limited to, is used as the light guide. Various shapes and curves can be applied to the side 306 for consideration of light collection efficiency. For example, the side 306 can be separated into several flat segments of different slopes. FIG. 3E illustrates the tilted top view of one example where the side of the light guide assembly includes two flat segments 307 and 308 with different slopes. The side 306 can also follow curved shapes, such as circular, parabolic, spherical or any other curved profile or surface. FIG. 3G illustrates a tilted top view of the example, the side 306 is of a circular profile (its side view is illustrated in FIG. 3H). As illustrated in FIG. 3I, one side 302 of a light guide segment (prism 301) is coupled to a PMT module 309 to allow light signals transmitted respectively through light guide segments to be converted, amplified and processed separately. It can be easily understood that such a configuration constitutes an on-axis annular detector with four equal and independent segments. In this example, the PMT modules 309 are respectively directly in contact with the sides of the light guide segments for compactness and minimum loss of light intensity. However, within the scope of the present invention, additional solid or hollow light guide extensions or optical fiber light guide section can also be incorporated between the PMT 309 and the side 302 of the light guide segment. One example is illustrated in FIG. 3J, where the side 310 is manufactured together with a side 311 to form a single-prism light guide segment. Furthermore, all sides of the light guide segment, exclusive of the side 312 in contact with an additional module, are coated with aluminum or other reflective material for internal light reflection.

Figure 4A:
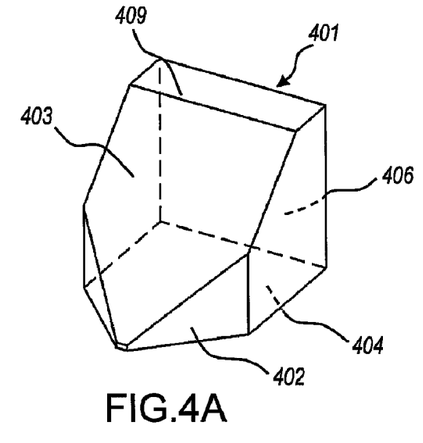
FIG. 4A to 4J shows detector assemblies in accordance with an embodiment of the present invention.
Figure 4B:
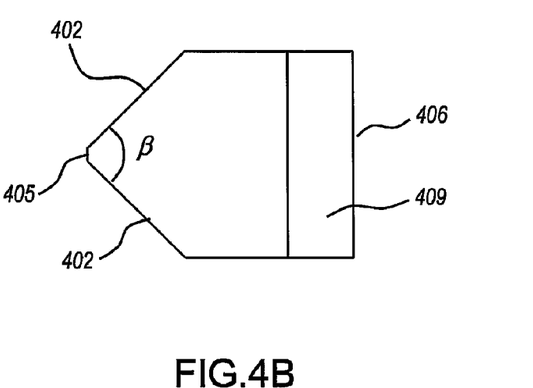
Figure 4C:
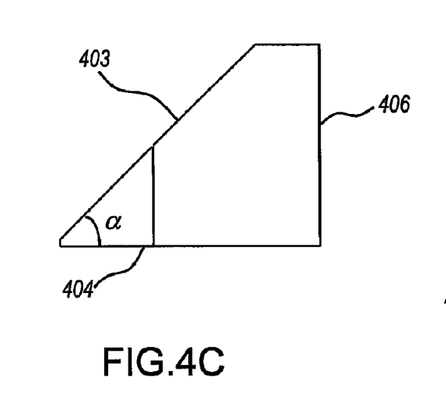
Figure 4D:
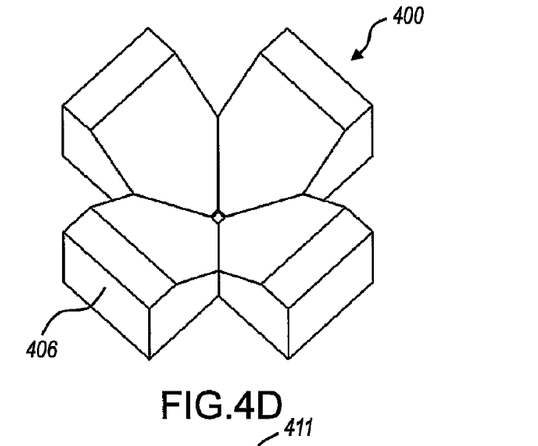
Figure 4E:
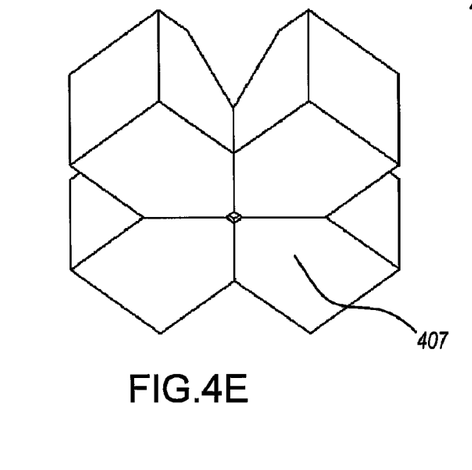
Figure 4F:
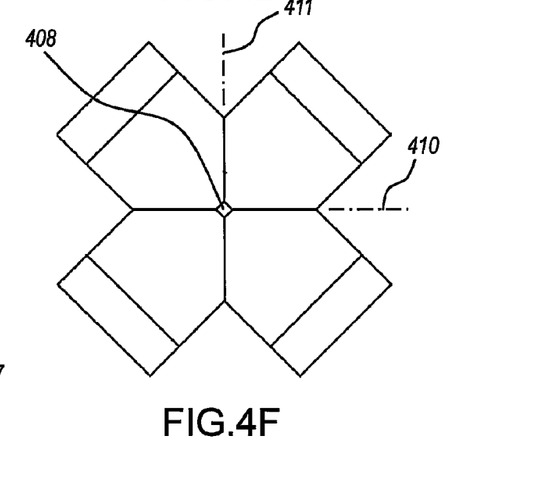
Figure 4G:
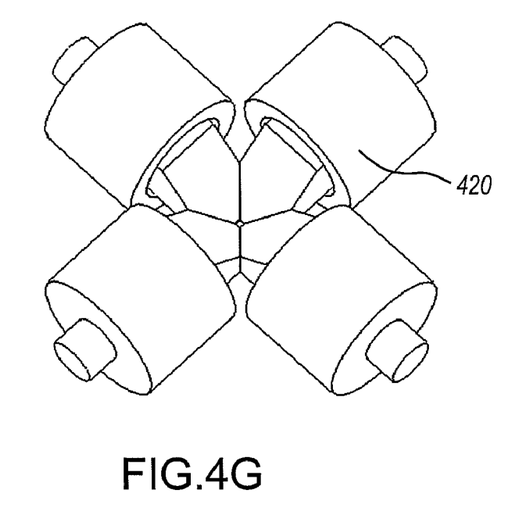
Figure 4H:
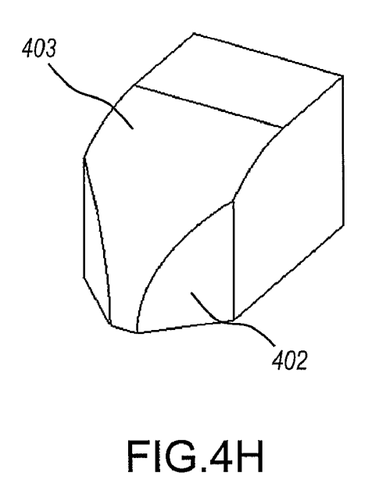
Figure 4I:
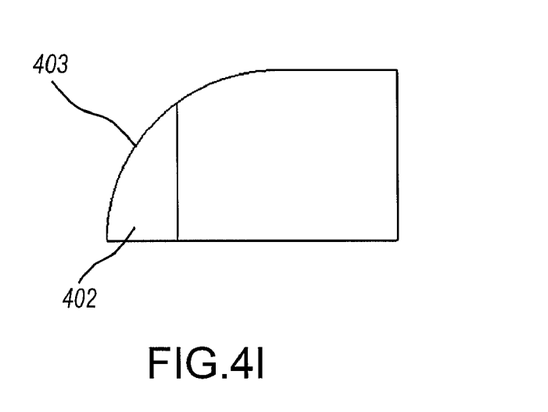
Figure 4J:
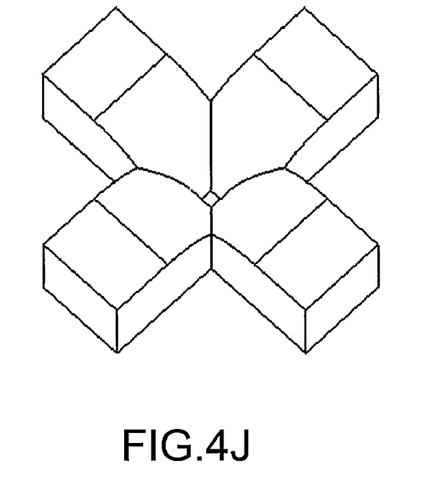

Another example of the charged particle detector in accordance with the present invention will be described in detail with reference to FIG. 4A through 4J. FIG. 4A to FIG. 4C show the tilt, top and side views of a triangular-prism light guide segment 401, respectively. Two symmetric 45-degree chamfers 402 are made at the front interface between a side 403 and a side 404, forming a 90-degree angle β with a flat front 405. The side 404 is first coated with a scintillator material (for example, phosphor scintillator such as P47) to form a detection surface, and then all sides of the light guide segment 401, exclusive of side 406, are coated with aluminum or other reflective material for internal light reflection and light isolation between adjacent modules. A plurality of light guide segments 401 in the manner are then joined together through the chamfer 402 to become a single detector light guide assembly 400, of which the tilted top view, tilted bottom view, and top view are illustrated in FIG. 4D through FIG. 4F, respectively. The sides 404 are coplanar aligned to form a flat detection surface 407 as illustrated in FIG. 4E. The assembled flat fronts 405 form a square center hole 408 as illustrated in the top view FIG. 4F. As viewed from the top the whole assembly is not only 90-degree rotational symmetric but also mirror symmetric with respect to the two orthogonal axes 410 and 411 passing through the center of the opening 408. This configuration addresses complete symmetry in signal collection. When installed in a charged particle instrument, the opening 408 will be aligned with the center optical axis of the instrument for allowing the primary charged particle beam to pass through. The angle α between the sides 403 and 404 of one light guide segment can be available between 0 and 90 degrees as illustrated in FIG. 4C, in accordance with the present invention. The side 406 of one light guide segment is coupled to a PMT module 420 to allow light signals respectively transmitted through the light guide segments to be converted, amplified and processed separately, as illustrated in FIG. 4G. Since the adjacent sides of the prism-light guide segment 401 are coated with the reflective material prior to being assembled together, light being transmitted in the respective segment does not cross from one segment into another. It can be easily understood that this configuration constitutes an on-axis annular detector with four equal and independent segments. In this example, a straight light guide segment 409 is used for compactness and minimum loss of light intensity. However, various length and shape of solid or hollow light guide or optical fiber light guide can be incorporated in front of the PMT 420 for the consideration of practical needs. As in the case of the examples described in the above paragraph, the front side of a triangular prism, for example but not limited to, is employed for the prism-light guide segment 401. Various shapes and curves can be applied to the side 403 for the consideration of light collection efficiency. For example, it can consist of several segments of straight sides with different slopes, or follow curved shapes, such as circular, parabolic, spherical or any other curved profile or surface. FIG. 4J illustrates one of such examples, where the side 403 of the light guide segment 401 has a circular profile as illustrated in its tilted view FIG. 4H and side view FIG. 4I.

Figure 5A:
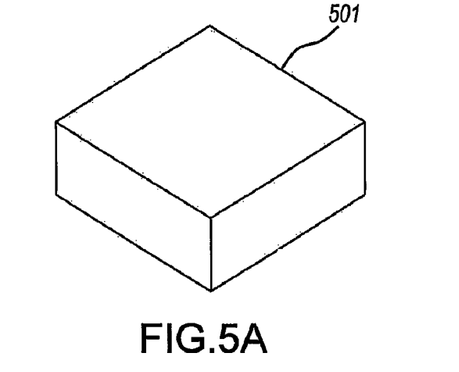
FIG. 5A to 5H shows detector assemblies in accordance with an embodiment of the present invention.
Figure 5B:
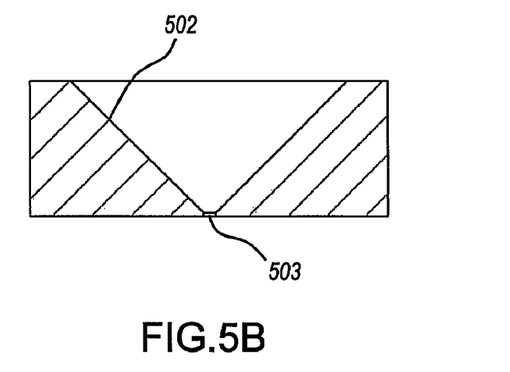
Figure 5C:
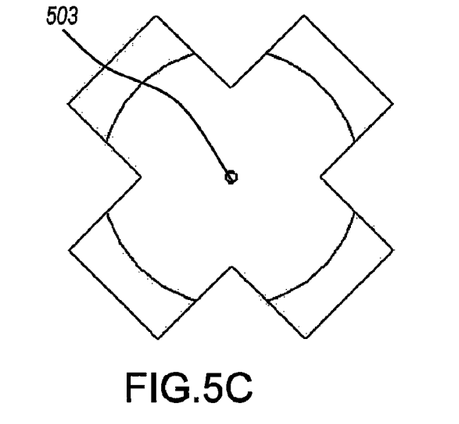
Figure 5D:
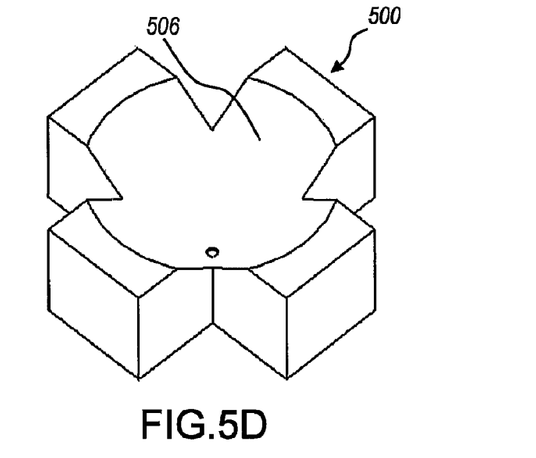
Figure 5E:
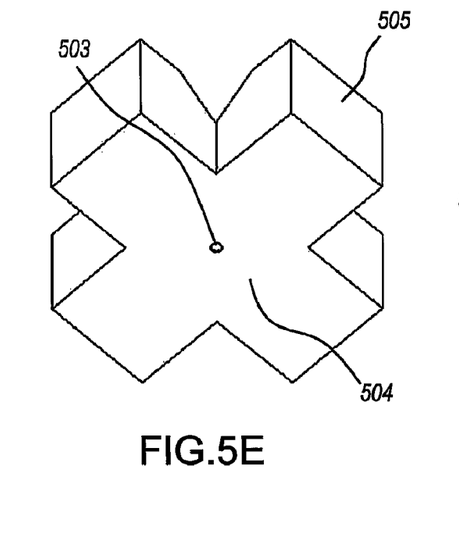
Figure 5F:
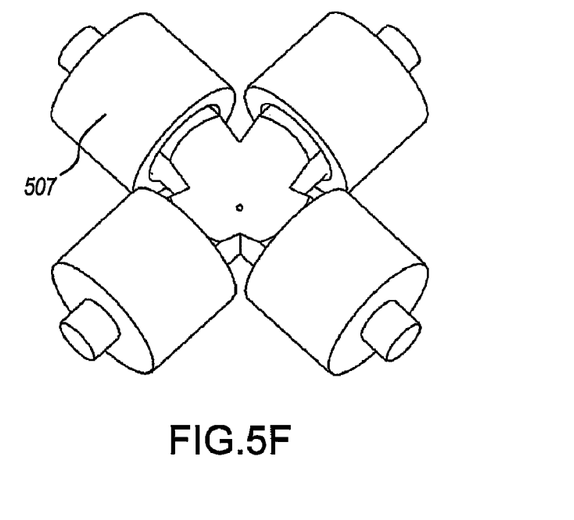
Figure 5G:
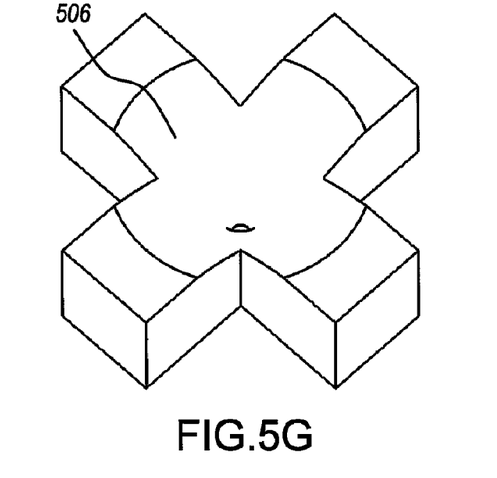
Figure 5H:
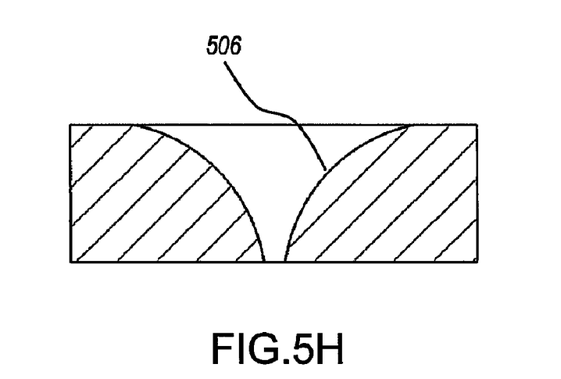

As disclosed above, four independent light guide segments can be assembled together to achieve the segmented on-axis annular configuration. This allows symmetric signal separation across two orthogonal axes (both X and Y axes of an image). However, for simplicity in manufacturing, it is also possible to approximate the segmented on-axis annular configuration by making the light guide assembly from a single piece of material. This type of example of the charged particle detector in accordance with the present invention will be described in detail with reference to FIG. 5A through FIG. 5H. A single rectangular block of light guide material 501, as illustrated in FIG. 5A, is first prepared and a center hole 503 is made out at the center of the light guide material 501. A cone shaped circular cutout 502 is made out from one side to the opposite side with respect to the center hole 503, as illustrated in FIG. 5B. Unnecessary material is then removed out of the rectangular block to form four extensive separate light guide paths with respective sides 505 as illustrated in FIG. 5D. FIG. 5C to 5E illustrate the top view, tilted top view and tilted bottom view of the resulting light guide module 500, respectively. The side 504 containing the center hole 503 is coated with the scintillator material for the charged particle detection surface. All sides, exclusive of the side 505, are coated with aluminum or other reflective material for internal light reflection. When installed in a charged particle instrument, the center hole 503 will be aligned with the center optical axis of the instrument for allowing the primary charged particle beam to pass through. The sides 505 are respectively coupled to PMT modules 507 to allow light signals exited from the corresponding side 505 to be converted, amplified and processed separately, as illustrated in FIG. 5F. It is possible for the light to exit form the sides 505 of the detection surface 504, since this example consists of only a single piece of material. However, with proper choice of shape for light reflection faces 506, it can be achieved that the majority of light exiting from the respective side 505 from the detector quadrant right in front of the side 505. Various profiles can be applied to the reflection faces 506 in accordance with the present invention. For example, the reflection face can consist of several segments of straight lines with different slopes, or follow curved profiles such as circular, parabolic or any other shape. FIG. 5G shows one of such examples, where the face 506 has a circular profile as illustrated in the cross-section view in FIG. 5H. In addition, even though examples with four separate light guide output paths are given in accordance with the present invention, when segmented on-axis annular configuration is not desired for certain cases of application, number of output light guide paths other than four can also be used.

Figure 6:
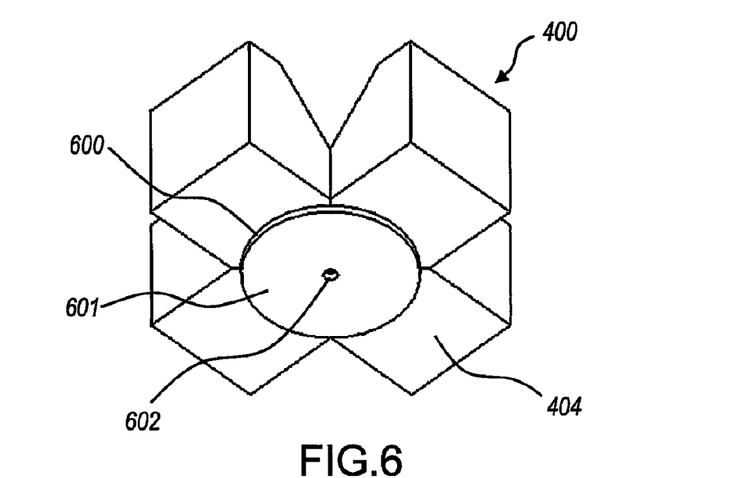
FIG. 6 shows a detector assembly in accordance with an embodiment of the present invention.

All the above examples have the bottom faces of the light guide segment coated with the scintillator material as the charged particle detection surface in order to achieve the best light transfer efficiency. However, some scintillator materials are difficulty directly coated over the light guide surface and available only in the existence of a pre-coating material such as single crystal. Thus, alternatively, the scintillator material may be in the form of a separate plate (for example, a single crystal disc of YAP or YAG material) or coating on a separate plate (for example, a glass or quartz disc coated with phosphor scintillator) and then be attached to the bottom face of the light guide assembly with the use of epoxy bonding or through mechanical means. In these examples, the area on the bottom face of the light guide segment which will be coupled to the separate scintillator material will not be coated with aluminum or any other light reflection material, in order to allow light to transmit through. FIG. 6 illustrates one of such examples, where a scintillator disc 600 addresses the examples aforementioned, the prism-light guide assembly 400 (as illustrated in FIG. 4E) as an example, to form a detector light guide assembly. The scintillator disc 600 is connected to the bottom face 404 and can be a single crystal scintillator material or a light guide material coated with a scintillator on its side 601. The center opening 602 of the disc 600 is aligned with the center opening 407 of the assembly 400 to allow passage of the primary charged particle beam when installed in a charged particle instrument.

Figure 7:
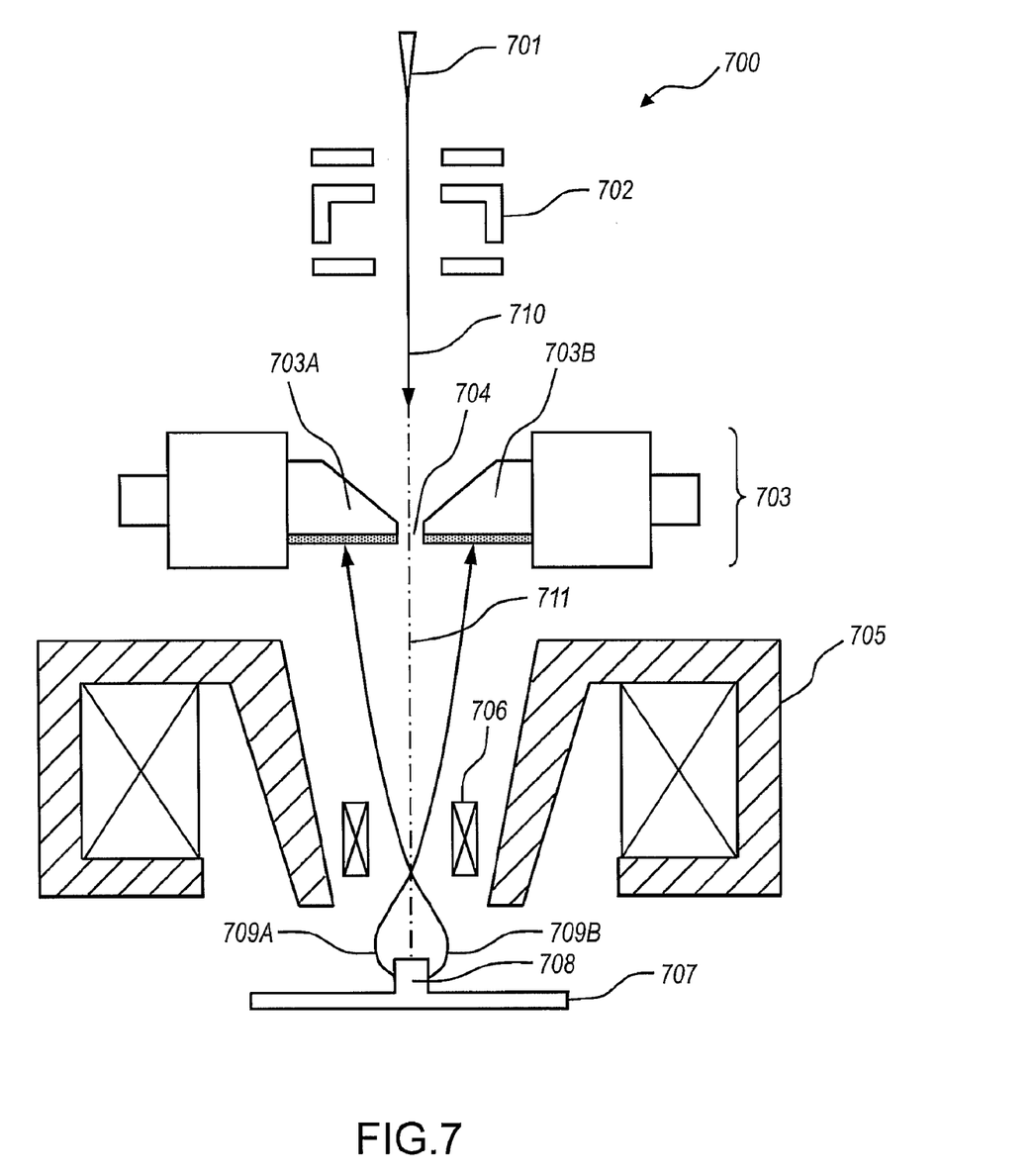
FIG. 7 is a schematic illustration of a scintillator type of detector assembly in accordance with the present invention being installed in a SEM as a segmented in-lens on-axis annual detector.

The incorporation of all the above-disclosed examples of the charged particle detector in accordance with the present invention into a charged particle beam instrument is schematically illustrated in FIG. 7. A scanning electron microscope (SEM) 700 is illustrated, includes an electron source 701, a condenser lens 702, a magnetic objective lens 705, a deflection unit 706, a specimen 707, and a segmented on-axis annular detector 703 in accordance with the present invention, with the center hole 704 of the detector 703 aligned with the optical axis 711 of the SEM 700. In this example, only the example as illustrated in FIG. 4G is illustrated, and for clarity only two out of the detector quadrants are illustrated as 703A and 703B. Other examples can be incorporated in the same fashion. Primary electron beam 710, emanated from the electron source, passing through the center hole 704 of the detector 703, strikes the specimen surface and generates secondary and back-scattered electrons. Two secondary electrons trajectories are illustrated as 709A and 709B. These two secondary electrons, emitted from either side of a surface feature 708 in different directions, with 709A to the left and 709B to the right, are pulled into the bore of the magnetic objective lens 705 and cross the center optical axis 711 by the combined actions of the immersion magnetic field and the electric retarding field, before arriving at the detector at opposite quadrants, with 709A arrives at 703B while 709B arrives at 703A. Independent outputs from the opposite detector quadrants will then show images of the surface feature 708 with edge shadowing effect of the opposite phase. The SEM specifically illustrated in FIG. 7 by no means limits the application of the present invention to this type of instrument with the above-described configurations. Examples in accordance with the present invention may be incorporated in a similar fashion in various types of charged particle instruments of different configurations.

Figure 8:
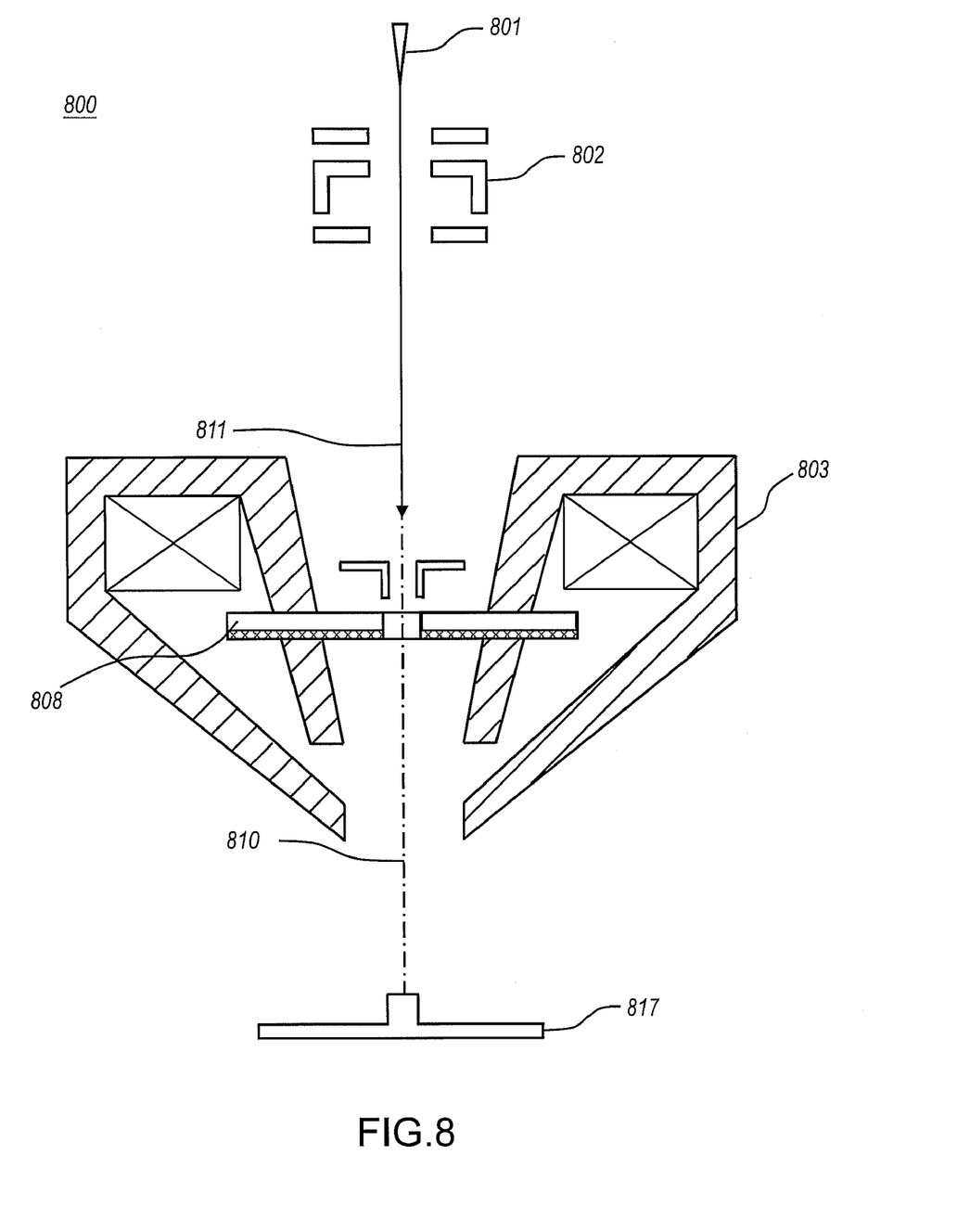
FIG. 8 is a schematic illustration of a MCP or semiconductor PIN type of detector assembly in accordance with the present invention being installed in a SEM as a segmented annular in-lens on-axis symmetrically distributed multi-channel detection system.
Figure 9:
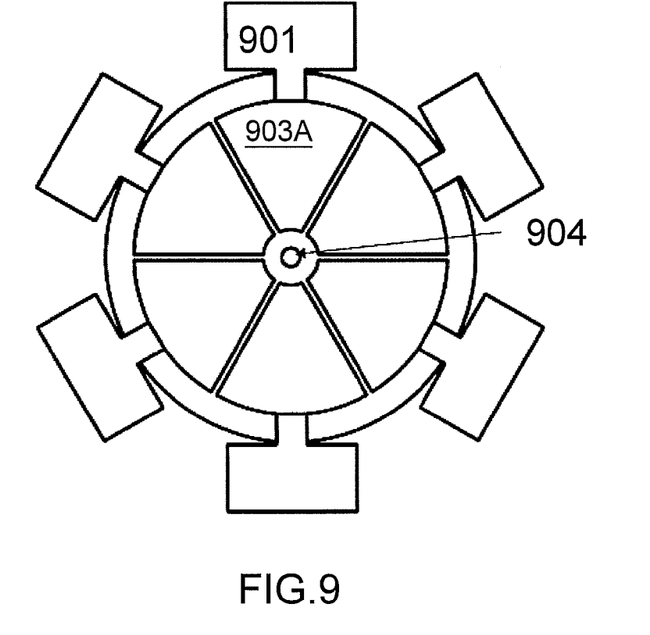
FIG. 9 shows a six-channel system. The segmented annual in-lens on-axis detection system can have two or more channels.

FIG. 8 is a schematic diagram illustrating an in-lens on-axis detection system in accordance with one embodiment of the present invention. An exemplary scanning electron microscope (SEM) 800 includes an electron emitter 801 for generating a primary electron beam 811, a condenser lens module 802 for condensing the primary electron beam 811, an electron beam deflection module (not shown) for scanning the electron beam probe across the surface of a specimen 817, and a charged particle detector 808. The exemplary charged particle detector 808 is further illustrated in FIG. 9. As shown in FIG. 8 and FIG. 9, the exemplary charged particle detector 808 comprises a center hole 904 aligned with the optical axis (can be presented by 811) of the SEM 800. The exemplary charged particle detector 808 is to receive electrons released from the specimen 817 upon being bombarded by the electron beam. The center hole 904 is arranged to align with the center optical axis 811 of the scanning electron microscope 800 in order to allow the primary electron beam 811 to pass through.

Figure 10:
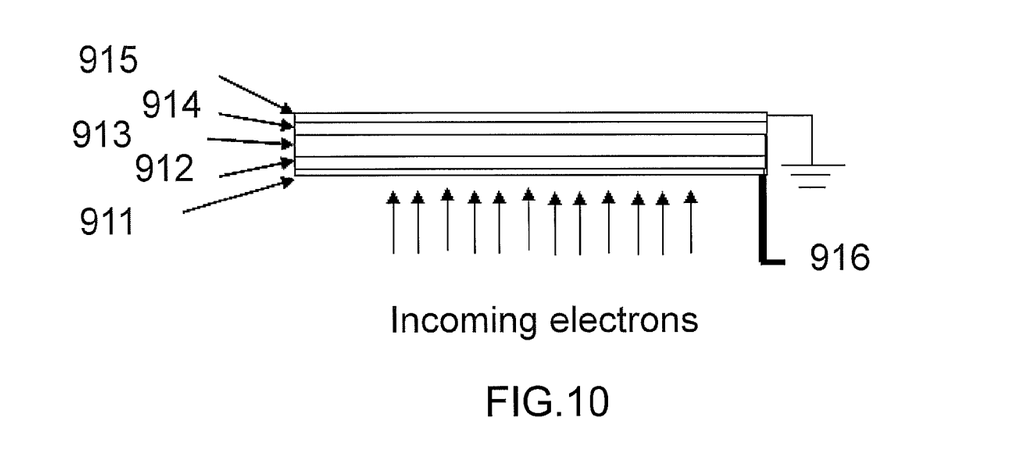
FIG. 10 is a schematic illustration of a semiconductor type.

As shown in FIG. 9, the charged particle detector 808 comprises a charged particle detection assembly that comprises a plurality of detection segments 903A. Each of the detection segments 903A is coupled to an independent pre-amplifier 901 for amplifying an output signal from the corresponding detection segment 903A. FIG. 10 is a cross-sectional diagram illustrating a detection module 900 implemented as a semiconductor type of detector in accordance with the present invention. As shown, the semiconductor type detector comprises a first conductive layer 911, a p-type semiconductor layer 912, an intrinsic (i-type) semiconductor layer 913, an n-type semiconductor layer 914 and a second conductive layer 915. In an example, the first conductive layer 911 is made of Al. The p-type semiconductor layer 912 is a p-type heavily-doped Si layer. The i-type semiconductor layer 913 is made of Si. The n-type semiconductor layer 914 is an n-type lightly-doped Si layer. The second conductive layer 915 is made of Au. Accordingly, the semiconductor structure may be used as a semiconductor diode detector with a p-i-n junction. The first conductive layer 911 and the second conductive layer 915 are used as electrodes. In the example, the first conductive layer 911 is coupled to an external conductive member 916 for outputting the detection signal. The second conductive layer 915 is grounded. E-beams are incident on the first conductive layer 911. The semiconductor type detection module 900 works on the principle that an energetic electron hitting a semiconductor will tend to loose its energy by producing electron-hole pairs. The number of electron-hole pairs will be dependent on the initial electron energy, so higher energy electrons will tend to contribute more to the generated detection signal. The holes will tend to migrate to one electrode of the detection module 900, while the electrons will migrate to the other, thus producing a current, the total of which is dependent on the electron flux and the electron energy.

Figure 11:
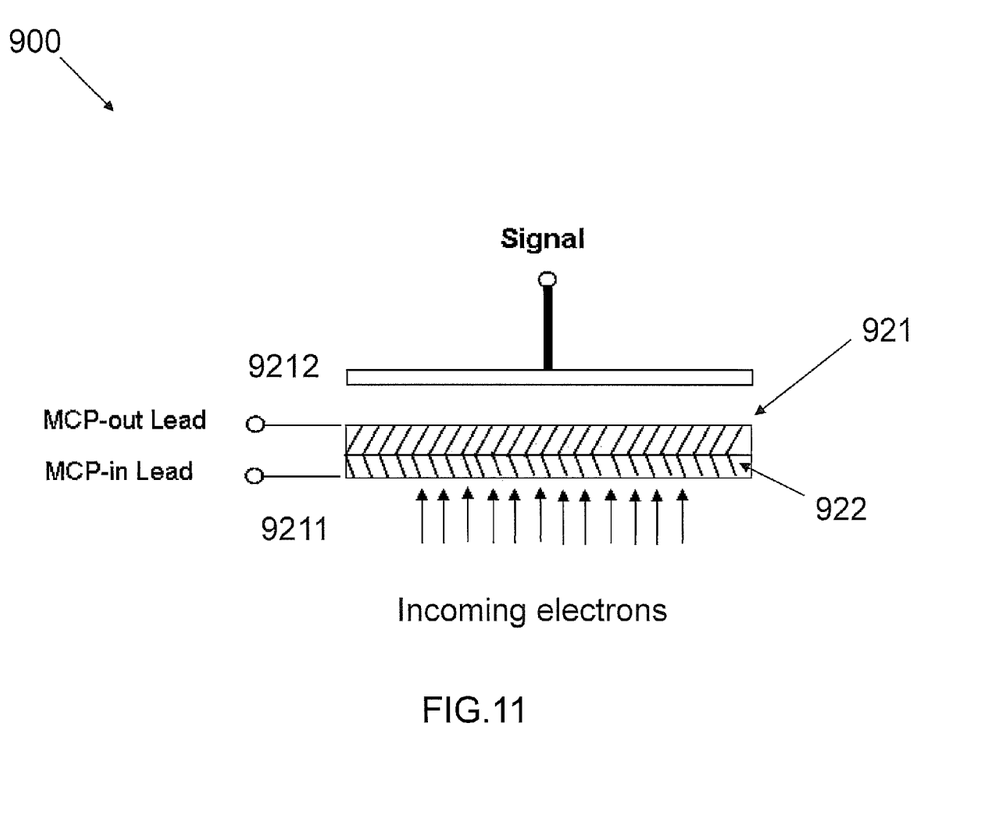
FIG. 11 is a schematic illustration of a Micro/Multi-channel (MCP) type detector.

FIG. 11 is a cross-sectional diagram illustrating a detection module 900 implemented as a multi-channel plate (MCP) type of detector in accordance with one embodiment of the present invention. As shown, an exemplary MCP type detector comprises a plate 921 consisting of a large number of tubes 922 stretching from one side to another. The plate has an "electron in" side 9211 and an "electron out" side 9212. Moreover, each side of the plate has an electrode coupled to MCP-in lead and a MCP-out lead, respectively, with the "electron in" side 9211 electrode at ground or slightly negative potential, and the opposite "electron out" side 9212 electrode at a substantial positive potential. The insides of the tubes 922 are coated with some material with a high secondary electron yield i.e. such material release secondary electrons upon being bombard by energized particles. In operation, secondary/backscattered electrons from the SEM specimen strike the inside of the tubes 922 (or possibly the front electrode, which also produces secondary electrons), which in turn causes emission of multiple electrons by the coating material. These produced electrons are in turn accelerated down the tube 922 by the potential between the two face electrodes, and at some point impact the tube wall, producing more electrons and repeating the process. This cascade effect causes each initial signal electron to produce a measurable current which can be used as a signal. Accordingly, such a MCP type detector is suitable for the use of detectors in the present invention.

Although the present invention has been described in accordance with the examples illustrated, one of ordinary skill in the art will readily recognize that there could be variations to the examples and those variations would be within the spirit and scope of the present invention. Accordingly, many modifications may be made by one of ordinary skill in the art without departing from the spirit and scope of the appended claims.

What is claimed is:

1. A charged particle detector for detecting secondary electrons, back-scattered electrons, or ions, comprising:
    a charged particle detection assembly comprising a plurality of detection segments, each of said detection segments being coupled to a pre-amplifier for amplifying an output signal of said detection segment,
    wherein each of said detection segments comprises a charged particle detection module having a charged particle receiver and a detection signal generator coupled to each other, said detection signal generator generates said output signal upon said charged particle receiver being bombarded by a charged particle beam.

2. The detector of claim 1, wherein said plurality of charged particle detection modules are coupled in an annular symmetric configuration, with an opening on the center symmetric axis, and with one equivalent surface on each said charged particle detection module aligned coplanarly to form a flat surface.

3. The detector of claim 2, wherein said flat surface is a charged particle receiver surface of said charged particle detector.

4. The detector of claim 1, wherein said charged particle detection assembly comprises at least two detection segments.

5. The detector of claim 1, wherein said charged particle detection module comprises a semiconductor charged particle detector.

6. The detector of claim 1, wherein said charged particle detection module comprises a divisional multi/micron channel plate (MCP).

7. A scanning electron microscope comprising:
    an electron emitter for generating a primary electron beam;
    a condenser lens module for condensing said primary electron beam;
    a probe forming objective lens module for focusing said primary electron beam into an electron beam probe;
    a specimen;
    an electron beam deflection module for scanning said electron beam across a surface of said specimen; and
    a charged particle detector, wherein said charged particle detector comprises a charged particle detection assembly, said charged particle detection assembly comprising a plurality of detection segments, each of said detection segments being coupled to a pre-amplifier for amplifying an output signal of said detection segment, wherein each of said detection segments comprises a charged particle detection module having a charged particle receiver and a detection signal generator coupled to each other, said detection signal generator generates said output signal upon said charged particle receiver being bombarded by a charged particle beam,
    wherein said charged particle detector is positioned to receive on its charged particle receiver surface electrons released from said specimen upon being bombarded by said electron beam probe, and said charged particle detector is arranged so that its opening is aligned with the center optical axis of said scanning electron microscope in order to allow said primary electron beam to pass through.

8. The scanning electron microscope of claim 7, wherein said plurality of charged particle detection modules are coupled in an annular symmetric configuration, with an opening on the center symmetric axis, and with one equivalent surface on each said charged particle detection module aligned coplanarly to form a flat surface, said flat surface being said charged particle receiver surface of said charged particle detector.

9. The scanning electron microscope of claim 7, wherein said charged particle detection assembly comprises at least two detection segments.

10. The scanning electron microscope of claim 7, wherein said charged particle detection module comprises a semiconductor charged particle detector.

11. The scanning electron microscope of claim 7, wherein said charged particle detection module comprises a divisional multi/micron channel plate (MCP).

12. The scanning electron microscope of claim 7, wherein said charged particle detector is positioned within said probe forming objective lens module.

13. The scanning electron microscope of claim 7, wherein said charged particle detector is positioned behind said probe forming objective lens module away from said specimen.

14. A method for detecting charged particles, comprising:
    providing a primary electron beam;
    condensing said primary electron beam;
    focusing said condensed primary electron beam into an electron beam probe by using a probe forming objective lens;
    providing an electron beam deflection unit;
    providing a specimen;
    causing said electron beam deflection unit to scan formed said electron beam probe across said specimen surface in a raster fashion;

providing a charged particle detector, wherein said charged particle detector comprises a charged particle detection assembly, said charged particle detection assembly comprising a plurality of detection segments, each of said detection segments being coupled to a pre-amplifier for amplifying an output signal of said detection segment, wherein each of said detection segments comprises a charged particle detection module having a charged particle receiver and a detection signal generator coupled to each other, said detection signal generator generates said output signal upon said charged particle receiver being bombarded by a charged particle beam;

and causing said charged particle detector to receive on its charged particle receiver surface electrons released from said specimen upon being bombarded by said electron beam probe.

15. The method of detecting charged particles of claim 14, wherein said plurality of charged particle detection modules are coupled in an annular symmetric configuration, with an opening on the center symmetric axis, and with one equivalent surface on each said charged particle detection module aligned coplanarly to form a flat surface, said flat surface being said charged particle receiver surface of said charged particle detector.

16. The method of detecting charged particles of claim 14, wherein said charged particle detection assembly comprises at least two detection segments.

17. The method of detecting charged particles of claim 14, wherein said charged particle detector is positioned within said probe forming objective lens module.

18. The method of detecting charged particles of claim 14, wherein said charged particle detector is positioned behind said probe forming objective lens module away from said specimen.

19. The method of detecting charged particles of claim 14, wherein said charged particle detection module comprises a semiconductor charged particle detector.

20. The method of detecting charged particles of claim 14, wherein said charged particle detection module comprises a divisional multi/micron channel plate (MCP).

* * * * *